(12) United States Patent
Shin et al.

(10) Patent No.: US 6,323,504 B1
(45) Date of Patent: Nov. 27, 2001

(54) SINGLE-ELECTRON MEMORY DEVICE USING AN ELECTRON-HOLE COULOMB BLOCKADE

(75) Inventors: Min Cheol Shin; Seong Jae Lee; Kyoung Wan Park, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/495,740

(22) Filed: Feb. 1, 2000

(30) Foreign Application Priority Data

Dec. 1, 1999 (KR) .................................................. 99-54157

(51) Int. Cl.⁷ ................................................... H01L 29/06
(52) U.S. Cl. ............................. 257/14; 257/20; 257/23; 257/24; 257/30
(58) Field of Search ................................. 257/9, 12, 14, 257/15, 17, 20, 23, 24, 30; 365/149, 150, 189.01

(56) References Cited

U.S. PATENT DOCUMENTS

| | | | |
|---|---|---|---|
| 5,677,637 | * 10/1997 | Nakazato et al. | 326/35 |
| 5,783,840 | * 7/1998 | Randall et al. | 257/24 |
| 5,844,834 | 12/1998 | Risch et al. | 365/150 |
| 5,905,273 | * 5/1999 | Hase et al. | 257/24 |
| 5,937,295 | * 8/1999 | Chen et al. | 438/257 |
| 6,057,556 | * 5/2000 | Gubin et al. | 257/39 |
| 6,194,737 | * 2/2001 | Ohshima | 257/30 |
| 6,211,530 | * 4/2001 | Goronkin et al. | 257/17 |

FOREIGN PATENT DOCUMENTS

| | | | |
|---|---|---|---|
| 7-307453 | * | 11/1995 | (JP) . |
| 11-150261 | * | 6/1999 | (JP) . |
| WO-94/15340 | * | 7/1995 | (WO) . |

OTHER PUBLICATIONS

Chen, R. H., et al., "Multiple–junction single–electron transistors for digital applications," Appl. Phys. Lett., 72 (1), Jan. 5, 1998, pp. 61–63.*

K. Nakazato et al., Single–electron memory, Journal of Applied Physics. vol. 75, No. 10, pp. 5123–5134, May 1994.

K.A. Matsuoko et al., "Single electron traps: A Quantitative comparison with theory and experiment," Journal of Applied Physics. vol. 81, No. 5, pp. 2269–2281, May 1997.

* cited by examiner

*Primary Examiner*—Sara Crane
(74) *Attorney, Agent, or Firm*—Seed IP Law Group, PLLC

(57) ABSTRACT

A single-electron memory device using the electron-hole Coulomb blockade is provided. A single-electron memory device in accordance with an embodiment of the present invention includes a plurality of quantum dot tunnel-junction arrays, a gate electrode, and source and drain electrodes. The plurality of quantum dot tunnel-junction arrays include at least two tunnel-junctions, are parallelly coupled to each other, and are well separated from each other to prevent single-electron tunneling between them. One of the plurality of quantum dot tunnel-junction arrays includes the gate electrode, and the voltage applied to the gate electrode can vary the number of electron-hole pairs. Each of the above-mentioned plurality of quantum dot tunnel-junction arrays includes separate source and drain electrodes where voltages are applied

5 Claims, 9 Drawing Sheets

FIG. 9 ns a single-electron memory device based on the electron-hole Coulomb blockade phenomena in the parallel-coupled single-electron tunnel-junction arrays

SINGLE-ELECTRON MEMORY DEVICE USING AN ELECTRON-HOLE COULOMB BLOCKADE

TECHNICAL FIELD

The present invention relates to a single-electron memory device based on the electron-hole Coulomb blockade phenomena in the parallel-coupled single-electron tunnel-junction arrays

BACKGROUND OF THE INVENTION

In order for an electron to tunnel through a single-electron tunnel-junction, the energy supplied by the voltage source should exceed the charging energy $E_c(=e^2/C)$, where C is the capacitance of the tunnel-junction.

If the size of metallic islands or quantum dots comprising the tunnel-junction system becomes sufficiently small, the charging energy becomes sufficiently large accordingly, and so it is possible that the Coulomb blockade gap, where no current flows, is seen in the bias voltage region where W(=eV) is smaller than $E_c$.

The single-electron device is based on the Coulomb blockade phenomena. The necessary conditions for the Coulomb blockade are that the charging energy should be much greater than the thermal energy ($k_B T$) and that the junction resistance should be greater than the resistance quantum ($R_K$=23.8KΩ). The latter is derived from the requirement that the metallic island or quantum dot should be isolated so that the electrons are well localized both in space and time.

The fact that the size of the quantum dots is necessarily small implies possibility of high device integration. And, since only a few electrons are needed for a device operation, very low power consumption may be achieved. Therefore, research and development of the single-electron devices are actively under way in advanced countries.

As a result of the research and development, there is a paper entitled "Single Electron Tunnel Junction Array", IEEE Transaction on Magnetics, Volume 25, Number 5, pp 1436–1439, by K. K. Likharev et al.

Also, there is a paper entitled "A Number study of the dynamics and statistics of single electron systems", Journal of Applied Physics, Volume 78, Number 5, pp 3288–3251, by L. R. C. Fonseca et al.

Also, there is a paper entitled "Additional Coulomb Blockade and Negative Differential Conductance in Closed Two-Dimensional Tunnel Junction Arrays", Journal of Applied Physics, Volume 84, Number 5, pp 2974–2976, by M. Shin et al.

Particularly, there have been numerous researches on single-electron memory devices, aiming at realization of ultra-high integration memory devices surpassing the physical limit of the existing silicon-based memory devices.

In the conventional memory devices, hundreds of thousands of electrons are needed to represent the binary values of 0 and 1. However, in the single-electron memory devices, only a few electrons are needed to achieve the same goal, enabling high integration and extremely low power consumption.

Among proposed single-electron memory devices making use of the Coulomb blockade phenomena, the single-electron trap consisting of the multiple tunnel-junction (MTJ) is noteworthy. The single electron trap comprises MTJ between the storage node with the self capacitance $C_0$ and the voltage source electrode. The number n of electrons in the storage node exhibits the bi-stable state with respect to the source-drain voltage V. The memory operation can be implemented within the hysteresis loop exhibiting the bi-stable state (for example, $0 \leq V \leq e/C_0$).

The stored electrons can be undesirably leaked by the thermal and quantum fluctuations. To reduce the effect of the thermal fluctuations, the self capacitance of the storage node and the capacitances of MTJ should be sufficiently small (1 aF for the room-temperature operation), and the number of MTJ should be greater than 10 to effectively prevent the influence of the quantum fluctuations.

As a result of such researches, there is U.S. Pat. No. 5,844,834 entitled "Single-electron memory cell configuration", issued on Dec. 1, 1998. Hereinafter, the afore-mentioned patent is described briefly.

In the single-electron memory device suggested in the above-mentioned patent, the single-electron tunnel-junctions showing the Coulomb blockade phenomena are arranged linearly and the storage node is attached to the end thereof. To prevent the leakage of the stored charges, the junction capacitances must be very small and a plurality of single-electron tunnel-junctions must exist between the storage node and the source electrode. Also, the single-electron transistor capable of reading the charge state in the storage node is electrically coupled to the storage node. The multiple tunnel-junction, the storage node and the single-electron transistor for reading are arranged between two electrodes so as to form a memory cell.

The charges stored in the memory node show the bi-stable state with respect to the voltage between two electrodes. A point in the hysteresis loop is designated as the read voltage and a point whose voltage is twice the read voltage is designated as the write voltage. When the voltage is varied from the read voltage to the write voltage, the zero-charge state region is passed through and, as the consequence, the charge state changes from −e to +e, enabling the write operation.

Each memory cell of an array has a single-electron transistor and a single-electron memory element. The single-electron transistor is driven by a charge stored in the memory element. When a read voltage is applied, a current flows through the single-electron transistor which is dependent on the stored charge, but the stored charge is not changed. When a write voltage is applied, the magnitude of which is greater than the read voltage, then the stored charge is changed. The memory cells of the array are each connected between the first lines and transverse second lines of a memory cell configuration.

Also, a paper entitled "single-electron memory cell", J. Applied Physics, Volume 75m No. 10, pp 5123–5134, by K. Nakazato et al. is disclosed. Hereinafter, the single-electron memory of the above-mentioned paper will be briefly described.

In the single-electron memory suggested in the above-mentioned paper, the multiple single-electron tunnel junctions are attached to one side of the storage node and a gate electrode, where a gate voltage is applied, is attached to the other side of the storage node. An electrometer, which is a single-electron transistor, is also weakly coupled to the storage node to read its charge state.

The charge state of the storage node shows bi-stability with respect to the gate voltage, and as the consequence, the voltage of the storage node exhibits the hysteresis loop with respect to the gate voltage. The hysteresis loop contains two internal values, low and high values, which can be designated to represent the memory state of 0 and 1, respectively.

The number of electrons involved to represent the high and low values are approximately 40 and they are very sensitive to the number of MTJs and the capacitance of the tunnel-junctions.

The basic memory operation is described in terms of the classical single-electron tunneling theory, where the Coulomb blockade and the free energy change by single-electron tunneling are considered. As electrons are transferred to the storage node one by one, the potential barrier builds up in the MTJ region and therefore the transferred electrons are trapped in the storage node.

An experimental memory circuit was fabricated using side-gated constrictions in δ-doped GaAs and the basic operation was confirmed from 30 mK up to liquid-helium temperature of 4.2 K in the above-mentioned paper. This memory can store information for longer than several hours. The intrinsic single-electron memory characteristics in a regime where cotunneling is neglected are investigated, and the overall characteristics are explained by a semiclassical model.

Also, a paper entitled "Single-Electron Traps: A Quantitative Comparison of Theory and Experiment", Journal of Applied Physics, Volume 81, Number 5, pp 2269–2281, by K. A. Matsuoka proposed the single-electron memory device. Hereinafter, the single-electron memory in the above-mentioned paper will be briefly described.

The single-electron memory device of the above-mentioned paper includes a single-electron trap based on submicron aluminum islands and Al/AlOx/Al tunnel junctions. The results of geometrical modeling using the FAST-CAP were used as input data for the general-purpose single-electron circuit simulator MOSES. The analysis indicates reasonable quantitative agreement between theory and experiment for those trap characteristics which are not affected by random offset charges. The observed differences can be readily explained by the uncertainty in the exact geometry of the experimental nanostructures.

Therefore, in the single-electron memory device described in the above-mentioned patent and papers, a plurality of MTJ are needed to prevent the leakage of electrons in the single-electron trap. Also, the tunnel-junctions must be uniform to prevent accidental trapping of electrons in the middle of MTJ and an elaborate operation is needed for the memory operation.

SUMMARY OF THE INVENTION

A single-electron memory device using the electron-hole Coulomb blockade is provided. A single-electron memory device in accordance with an embodiment of the present invention includes a plurality of quantum dot tunnel-junction arrays, a gate electrode, and source and drain electrodes. The plurality of quantum dot tunnel-junction arrays include at least two tunnel-junctions, are parallelly coupled to each other, and are well separated from each other to prevent single-electron tunneling between them. One of the plurality of quantum dot tunnel-junction arrays includes the gate electrode, and the voltage applied to the gate electrode can vary the number of electron-hole pairs. Each of the above-mentioned plurality of quantum dot tunnel-junction arrays includes separate source and drain electrodes where voltages are applied.

Preferably, the single-electron memory device of the present invention further includes a quantum dot tunnel-junction array. The quantum dot tunnel-junction array is positioned oppositely to the quantum dot tunnel-junction array to which the gate electrode is attached, and electrically weakly coupled to the adjacent quantum dot tunnel-junction array which is one of the above-mentioned plurality of quantum dot tunnel-junction arrays, thereby measuring the potential changes of the quantum dots of the single-electron memory device of the present invention.

Preferably, each of the parallel coupled quantum dot tunnel-junction arrays contains odd number of quantum dots. Each of the said quantum dot tunnel-junction arrays is electrically coupled to each other only through the quantum dots located in the middle of each of the said quantum dot tunnel-junction arrays, thereby preventing the fluctuation of the number of said electron-hole pairs.

Preferably, to prevent the fluctuation of the number of said electron-hole pairs by the quantum fluctuations, at least one double-junction quantum dot array is vertically coupled to the said parallel coupled quantum dot tunnel-junction arrays.

Preferably, the quantum dot that is coupled to the said gate electrode includes the source and drain electrodes where voltages are applied, thereby controlling the number of said electron-hole pairs.

BRIEF DESCRIPTION OF THE DRAWINGS

The embodiments of the present invention will be explained with reference to the accompanying drawings, in which.

DETAILED DESCRIPTION OF THE INVENTION

An embodiment of the present invention will hereinafter be described with reference to the drawings.

Figure 1:
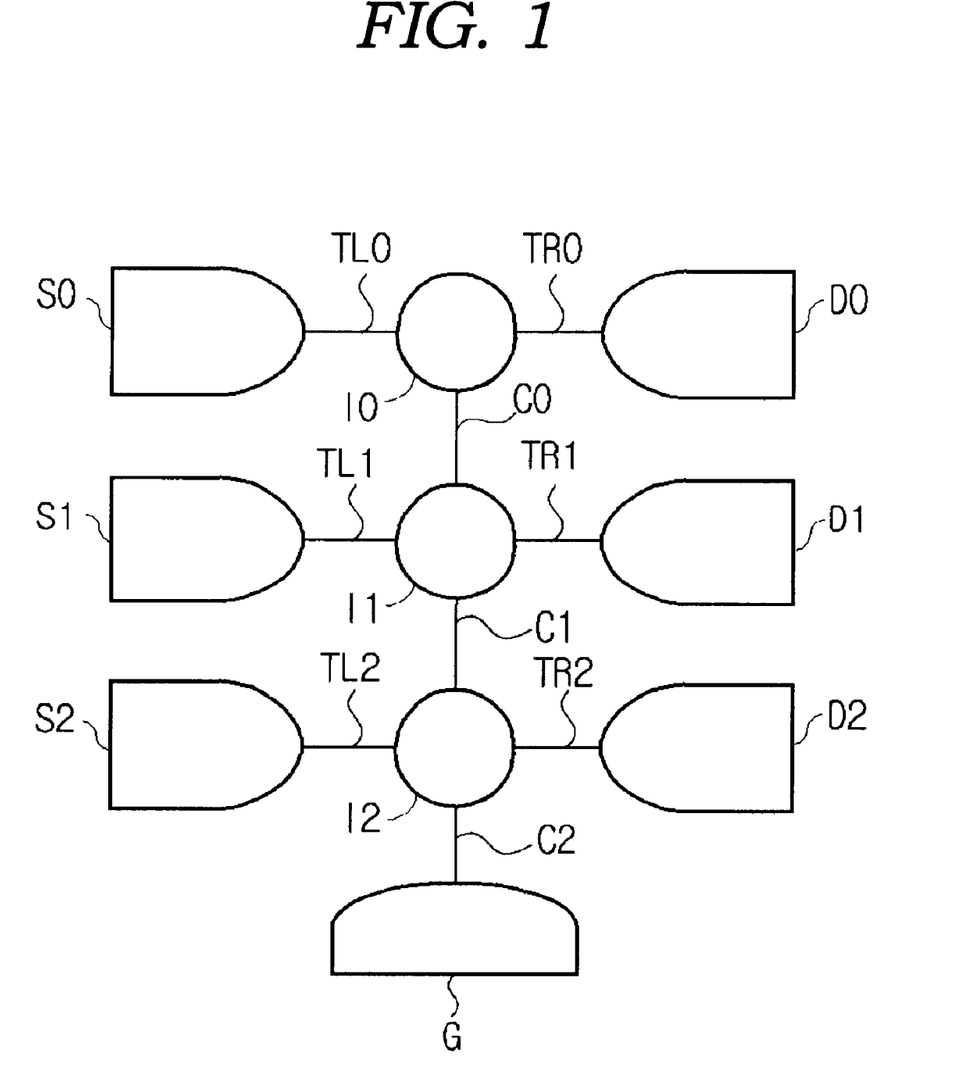
FIG. 1 shows the structure of parallel-coupled single-electron tunnel-junction arrays according to an embodiment of the present invention.

FIG. 1 shows the structure of parallel-coupled single-electron tunnel-junction arrays according to an embodiment of the present invention.

A quantum dot I1 is connected to the source electrode S1 and the drain electrode D1 through the tunnel-junctions TL1 and TR1, respectively. A voltage V⁺ is applied to the source electrode S1 and a voltage V⁻ is applied to the drain electrode D1.

Another quantum dot I2 is connected to the source electrode S2 and the drain electrode D2 through the tunnel-junctions TL2 and TR2, respectively. Both the source electrode S2 and the drain electrode D2 are grounded.

The quantum dots I1 and I2 are electrically strongly coupled through the junction C1 with capacitance $C_a$, but no single-electron tunneling is allowed through the junction.

A gate electrode G is attached to the quantum dot I2 and a voltage $V_G$ is applied to the gate electrode G. The capacitance of the junction C2 between the quantum dot I2 and the gate electrode G is $C_G$.

Another quantum dot I0 is electrically weakly coupled to the quantum dot I1 through the junction C0. Separate source electrode S0 and drain electrode D0 are connected to the quantum dot I0 through the tunnel-junctions TL0 and TR0, respectively. The quantum dot I0 acts as the potentiometer to measure the potential of the quantum dot I1, by measuring the current through the source S0 and the drain D0 when a small voltage is applied across the source S0 and the drain D0. In the present invention, the tunnel junctions TL0, TL1, TL2, TR0, TR1, TR2 have identical values for the capacitance and resistance, C and R, respectively, for simplicity.

Figure 2:
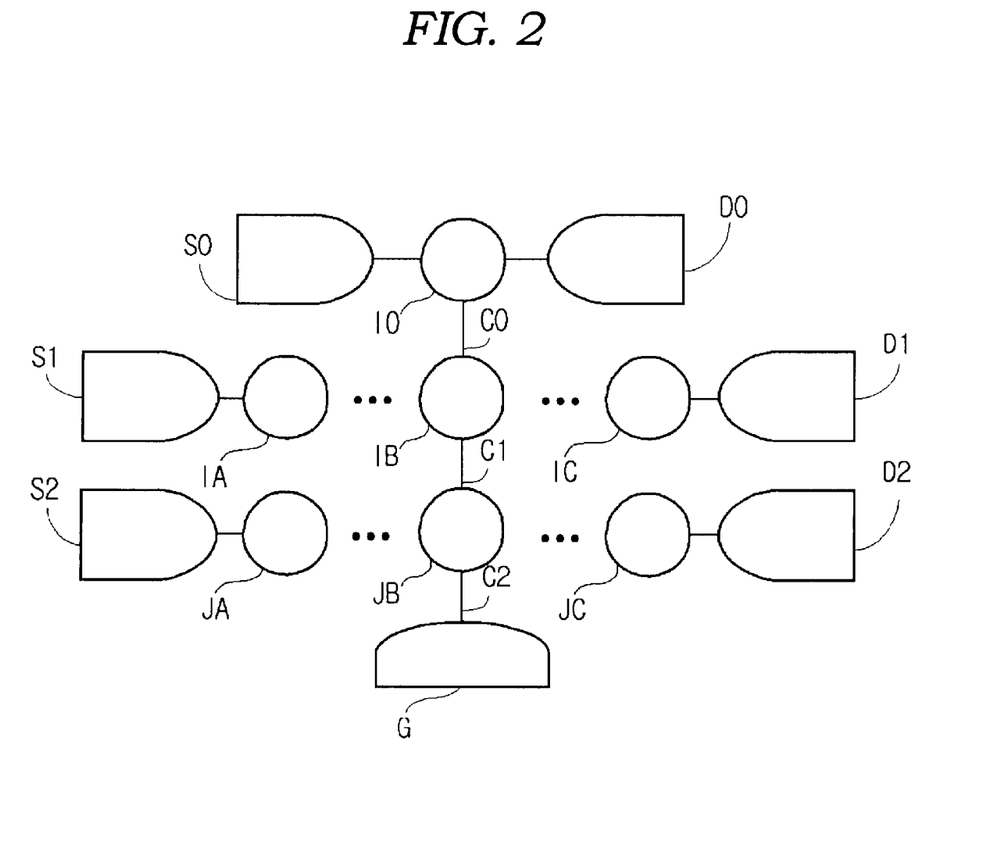
FIG. 2 shows the horizontally expanded structure of the basic structure of the parallel-coupled single-electron tunnel-junction arrays in FIG. 1.

FIG. 2 shows a horizontally expanded structure of the basic structure of parallel-coupled single-electron tunnel-junction arrays in FIG. 1.

In FIG. 2, each tunnel-junction array consists of N quantum dots, IA, IB, . . . , IC and JA, JB, . . . , JC, respectively, where N is an odd integer greater than 1, whereas each tunnel-junction array of FIG. 1 contains only one quantum dot. The parallel-coupled tunnel-junction arrays are electrically coupled through the quantum dots IB and IC which are located at the middle of the arrays.

Figure 3:
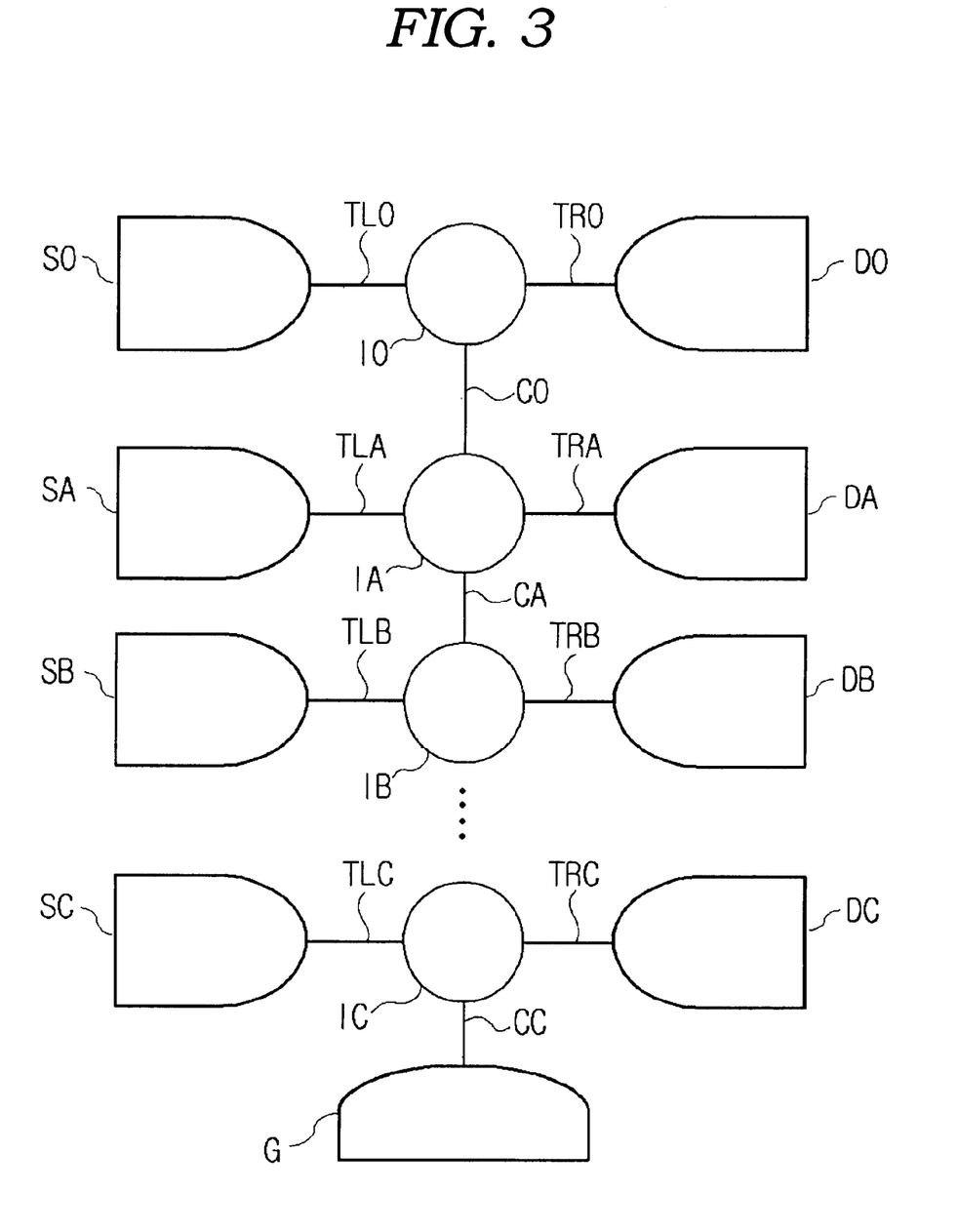
FIG. 3 shows the vertically expanded structure of the basic structure of the parallel-coupled single-electron tunnel-junction arrays in FIG. 1.

FIG. 3 shows a vertically expanded structure of the basic structure of parallel-coupled single-electron tunnel-junction arrays in FIG. 1.

In FIG. 3, more than two double-junction arrays are parallely coupled whereas two double-junction arrays are parallelly coupled in FIG. 1. M quantum dots, IA, IB, . . . , IC, are parallelly coupled to one another and separate source and drain electrodes are attached to each of said M quantum dots. The voltages V⁺ and V⁻ are applied to the source electrode SA and the drain electrode SB, respectively, whereas the rest source electrodes SB, . . . , SC and the rest drain electrodes DB, . . . , DC, are all grounded. The gate electrode G is attached to the quantum dot IC and the voltage $V_G$ is applied to the gate electrode.

The structures of FIG. 2 and FIG. 3 are expanded ones of that of FIG. 1 so as to more effectively prevent the leakage of stored information. The memory operation principle of them are the same as that of the structure of FIG. 1. Therefore the description of the operation principle of the single-electron memory device of the embodiment according to the present invention is limited to the structure of FIG. 1.

Figure 4:
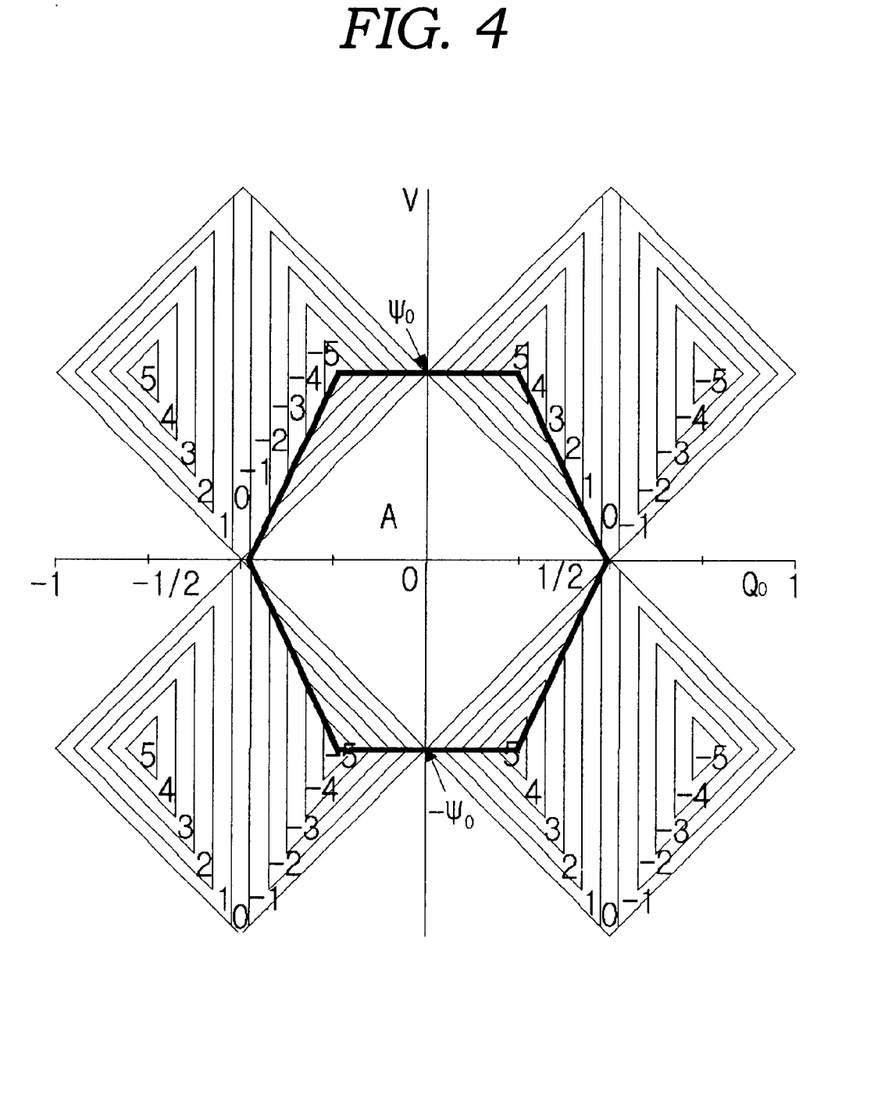
FIG. 4 is a stability diagram with respect to the source-drain voltage and gate charge when symmetrical voltages are applied to the source and drain electrodes of the device in FIG. 1.

FIG. 4 is the stability diagram with respect to the source-drain voltage and the gate charge when the symmetrical source-drain bias voltage is applied to the structure of FIG. 1.

In FIG. 4, the stability diagram is drawn with respect to V and $Q_0$ when the voltages V/2 and −V/2 are applied to the source electrode S1 and the drain electrode D1, respectively, and the voltage $V_G(=C_G Q_0)$ is applied to the gate electrode G. As shown in FIG. 4, the stability diagram is characterized by fragmentation of the diamond-shaped area into the triangular sub-domains. If we denote $(n_1, n_2)$ by the charge configuration of the system when there are $n_2$ charges on the said quantum dot I1 and $n_2$ charges on the said quantum dot I2, the stable charge configuration of the triangular sub-domain labeled by the integer n is (−n,n). The integer n takes values between $−n_s$ and $n_s$ where $n_s$ is given by Equation 1, $$n_S = \left\lceil \frac{(C_a + 2C)^2}{8C(C_a + C)} \right\rceil \cong \left\lceil \frac{C_a}{8C} \right\rceil \text{ for } C_a >> C, \quad \text{[Equation 1]}$$

where $\lceil x \rceil$ is the greatest integer not exceeding x.

The triangular sub-domains in FIG. 4 appear when the coupling capacitance $C_a$ between the said quantum dot I1 and the said quantum dot I2 is sufficiently greater than the tunnel-junction capacitance C ($C_a \geq 8C$). The operation principle of the single-electron memory device of the present invention takes advantage of the triangular sub-domains that appear when the aforementioned strong coupling condition is satisfied, as will be discussed in detail later.

Therefore it is necessary that the coupling between the parallel quantum-dot arrays be strong for the operation of the single-electron memory device according to the embodiment of the present invention.

The triangular sub-domains of FIG. 4 are constructed from the single-electron tunneling conditions across the said tunnel-junctions TL1, TR1, TL2, and TR2. The tunneling conditions are obtained from the relevant free energy considerations. The free energy F is given by the electrostatic energy E subtracted by the work done W by the voltage supplier. W is given by eV, and E is given by Equation 2, $$E = \frac{\Psi_0}{2}(n_1^2 + n_2^2)e + \frac{C_a}{4C(C + C_a)} n_1 n_2 e^2, \quad \text{where} \quad \text{[Equation 2]}$$

$$\Psi_0 = \frac{e}{4C} \frac{C_a + 2C}{C_a + C}.$$

If the free energies for the single-electron tunneling across the tunnel-junctions TL1, TR1, TL2, and TR2 are considered, the condition that the charge configuration (−n, n) is stationary is obtained as follows.

$$V < \frac{ne}{C_a + C} + (1 - 2Q_0)\Psi_0 \quad \text{[Equation 3]}$$

$$V < -\frac{ne}{C_a + C} + (1 + 2Q_0)\Psi_0$$

$$Q_0 < -\frac{2C}{C_a}ne + \frac{e}{2} + \frac{C}{C_a}e$$

for $0 \leq Q_0 \leq 1/2$

In FIG. 4 is marked the hexagonal region A that consists of the diamond-shaped region without the triangular sub-domain fragmentation and parts of the surrounding four diamond-shaped regions with the triangular sub-domain fragmentation. The single-electron memory device operates in region A.

Figure 5:
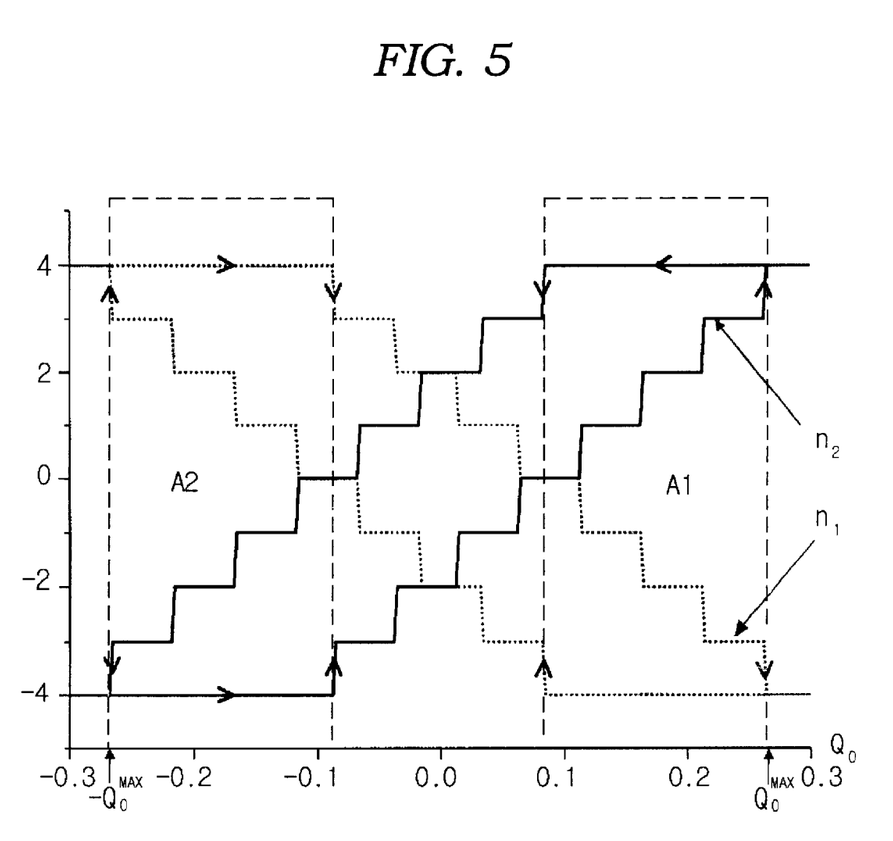
FIG. 5 is a graph of $n_1$ and $n_2$, the number of the electrons on the upper and lower dots, respectively, with respect to the gate charge when symmetrical voltages are applied to the source and drain electrodes of the device in FIG. 1.

FIG. 5 is the graph of $n_1$ and $n_2$ with respect to the gate charge, where $n_1$ and $n_2$ are the number of electrons trapped on the said quantum dot I1 and I2, respectively, when the symmetrical voltage is applied to the source-drain electrodes S1 and D1.

In FIG. 5, it is seen that $n_2$ equals to $−n_1$ with the hysteric characteristics with respect to the gate voltage change. The hysteresis is seen in the regions A1 and A2, where the free energy relationship in Equation 4 is satisfied:

$$F(-n,n) > F(-n-1, n+1).$$ [Equation 4]

Therefore, in the above-mentioned A1 and A2 regions, the system prefers to be in the state where there are as many electron-hole pairs as possible. When the gate voltage is lowered from the edge $Q_0^{max}$ of the A1 region, the number n of electron-hole pairs retains $n_s$, the extreme of the number of electron-hole pairs, while inside the A1 region, but outside the A1 region, the number of electron-hole pairs gradually decreases and reaches $-n_s$ at $-Q_0^{max}$. If the direction of the gate voltage sweep is reversed and the gate voltage is increased from $-Q_0^{max}$, the number n of electron-hole pairs retains $-n_s$ while inside the region A2, but outside the region A2, the number of electron-hole pairs gradually increases and reaches $n_s$ at $Q_0^{max}$. Therefore, the system exhibits the bistability in the above-mentioned A region.

Figure 6:
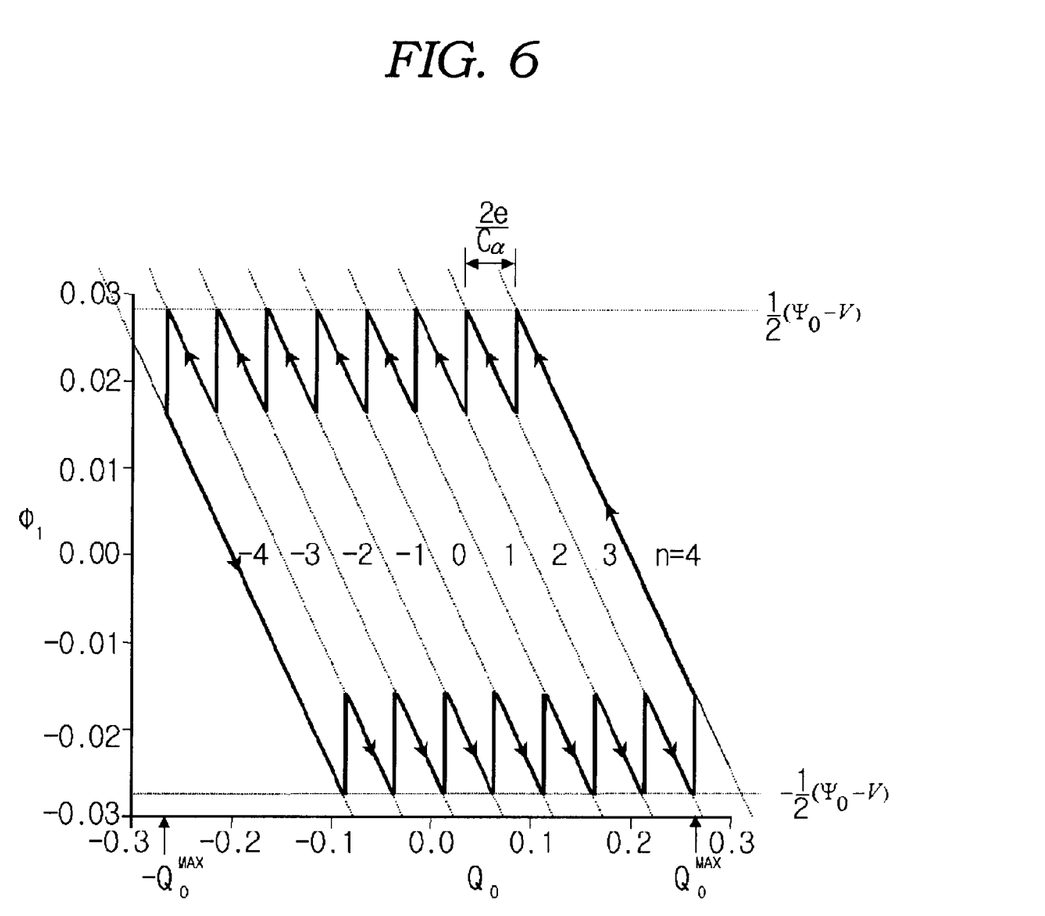
FIG. 6 shows the hysteresis loop exhibiting the memory operation of the single-electron memory device of the present invention when symmetrical voltages are applied to the source and drain electrodes of the device in FIG. 1.

FIG. 6 shows the hysteresis loop which enables the memory operation of the single-electron memory device of the present invention when the symmetrical voltage is applied across the source-drain electrodes of FIG. 1.

FIG. 6 is the graph of the potential $\Phi_1$ of the said quantum dot I1 with respect to the gate charge $Q_0$ in the region A exhibiting the bistability.

The potential $\Phi_1$ which is the function of n, the number of electron-hole pairs, shows bistability in the region A because n is bistable in the region as seen in FIG. 5.

Since $n = n_2 = -n_1$ in the region A, where $n_1$ and $n_2$ are the number of charges on the quantum dots I1 and I2, respectively, the potential $\Phi_1$ of the quantum dot I1 is given by Equation 5 as follows:

$$\Phi_1 = -\Psi_0 \left( -\frac{2C}{C_a + 2C} n + \frac{C_a}{C_a + 2C} \frac{Q_0}{e} \right)$$ [Equation 5]

Since n changes from $-n_S$ to $n_S$, $\Phi_1$ has $2n_s+1$ branches, separated equidistantly by $2e/C_a$ from one another.

Referring to FIG. 6, the operation principle of the single-electron memory device according to the embodiment of the present invention can be understood. In FIG. 6, when the gate voltage is at $Q_0^{max}$, the potential $\Phi_1$ of the quantum dot I1 is on the $n_S$-th branch and takes the value close to $\Phi_{low} = -(\Psi_0 - V)/2$. If the gate potential is gradually decreased from $Q_0^{max}$, the potential $\Phi_1$ linearly increases along the $n_S$-th branch, but at the moment when $\Phi_1 = \Phi_{high} = (\Psi_0 - V)/2$, the potential $\Phi_1$ jumps to $(n_S-1)$-th branch. If the gate voltage is further decreased, the potential $\Phi_1$ linearly increases along the $(n_S-1)$-th branch, but the potential $\Phi_1$ hits $\Phi_{high}$ again, it makes transition to the next branch. This inter-branch transitions are repeated until the gate voltage reaches $-Q_0^{max}$ so that the potential $\Phi_1$ finally reaches the $(-n_S)$ branches.

The direction of the gate voltage sweep then reverses and the gate voltage is increased from $-Q_0^{max}$. Then the potential $\Phi_1$ linearly decreases along the $(-n_S)$-th branch, but at the moment when $\Phi_1 = \Phi_{low}$, the potential $\Phi_1$ jumps to $(-n_S+1)$-th branch. If the gate voltage is further increased, the potential $\Phi_1$ linearly decreases along the $(-n_S+1)$-th branch, but the potential $\Phi_1$ hits $\Phi_{low}$ again, it makes transition to the next branch. This inter-branch transitions are repeated until the gate voltage reaches $Q_0^{max}$ so that the potential $\Phi_1$ finally reaches the $n_S$ branches.

The above-mentioned operation cycle shows that for the gate-voltage sweep-up, the potential $\Phi_1$ of the quantum dot I1 fluctuates around the value $\Phi_{low}$, but for the gate-voltage sweep-down, the potential $\Phi_1$ of the quantum dot I1 fluctuates around the value $\Phi_{high}$.

The memory operation is implemented using the above-mentioned hysteresis loop. That is, the binary state '0' is represented by the potential $\Phi_1$ of the quantum dot I1 at $\Phi_{low}$ and the binary state '1' is represented by the potential $\Phi_1$ of the quantum dot I1 at $\Phi_{high}$.

For the read operation, the potential $\Phi_1$ of the quantum dot I1 is read by measuring the current through the quantum dot I0 which is weakly coupled to the quantum dot I1 as shown in FIG. 1.

For the write operation, if the memory state is '0', a pulse of height $Q_0^{max}/C_a$ is applied to the gate electrode G to change the memory state to '1'. If the memory state is '1', a pulse of height $-Q_0^{max}/C_a$ is applied to the gate electrode G to change the memory state to '0'.

The above-mentioned memory operation may be hindered by the thermal fluctuations and the quantum fluctuations. To reduce the influence of the thermal fluctuations, the capacitances of the tunnel-junctions and the self-capacitances of the quantum dots comprising the arrays should be sufficiently small. It is estimated that the typical capacitance of the system should be on the order of 1 aF for operation at relatively high temperatures.

To reduce the influence of the quantum fluctuations, the tunnel-junction resistance should be sufficiently large, on the order of 1 MΩ in the present embodiment. The structures in FIGS. 2 and 3 more effectively reduce the errors caused by the quantum fluctuations.

Figure 7:
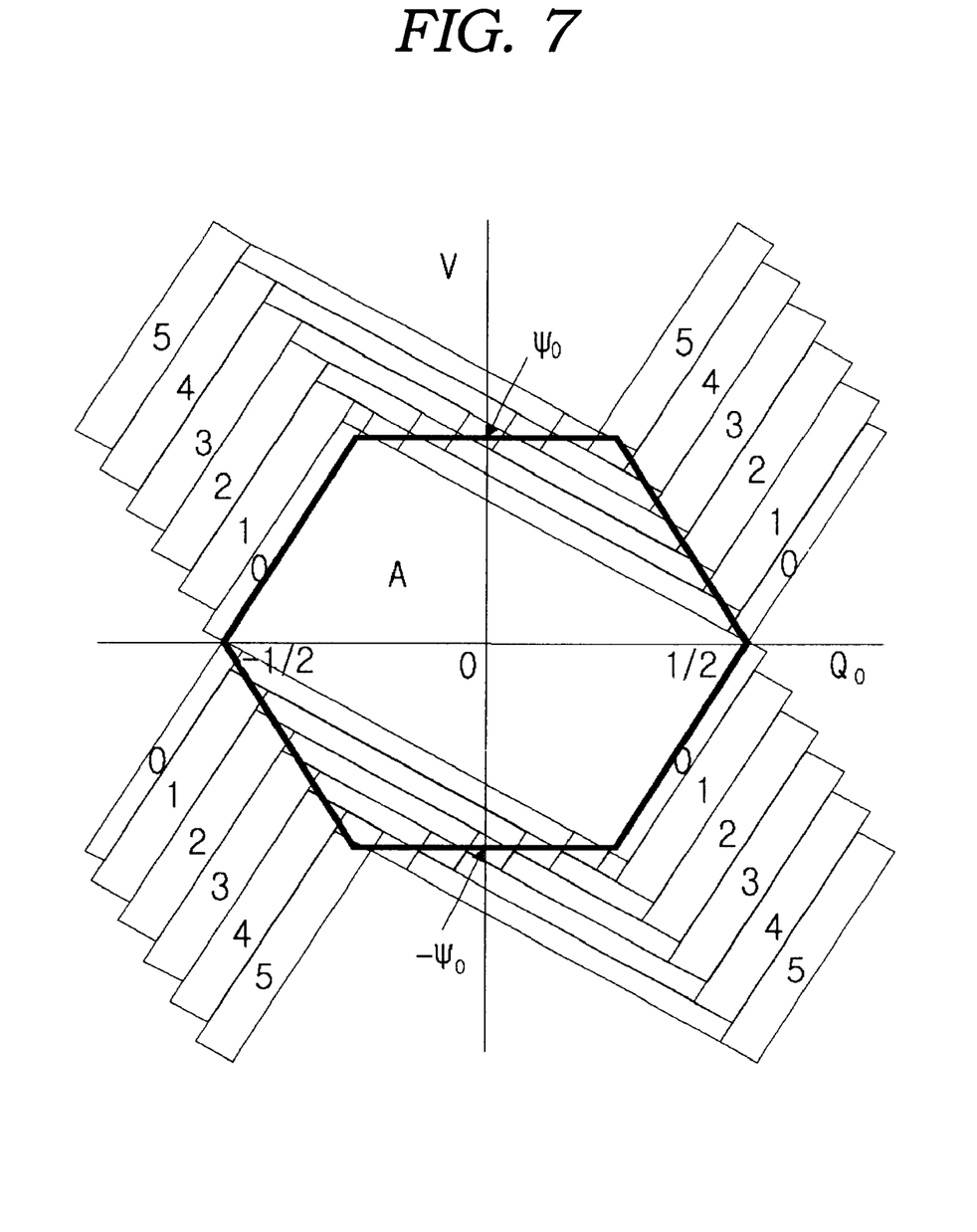
FIG. 7 is a stability diagram with respect to the source-drain voltage and gate charge when asymmetrical voltages are applied to the source and drain electrodes of the device in FIG. 1.

FIG. 7 is the stability diagram with respect to the source-drain voltage and the gate charge when the asymmetrical source-drain bias voltage is applied to the structure of FIG. 1.

For the asymmetrical source-drain voltages, the sub-domains are rectangular, as shown in FIG. 7, whereas for the symmetrical source-drain voltages, the sub-domains are triangular, as shown in FIG. 4. However, the region A where the single-electron memory device of the present invention operates is the same regardless of the way the source-drain voltages are applied.

FIG. 5 is the graph of $n_1$ and $n_2$ with respect to the gate charge, where $n_1$ and $n_2$ are the number of electrons trapped on the said quantum dot I1 and I2, respectively, when the asymmetrical voltage is applied to the source-drain electrodes S1 and D1.

Figure 8:
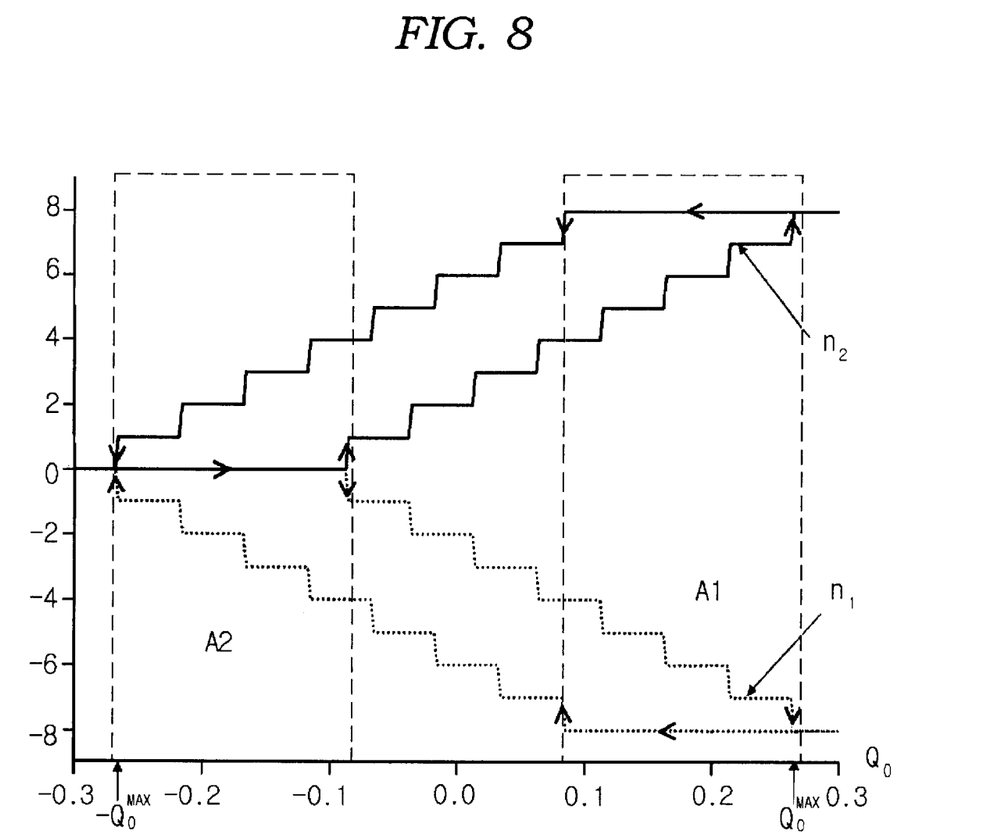
FIG. 8 is a graph of $n_1$ and $n_2$, the number of the electrons on the upper and lower dots, respectively, with respect to the gate charge when asymmetrical voltages are applied to the source and drain electrodes of the device in FIG. 1.

For the asymmetrical source-drain voltages, $n = n_2 = -n_1$ with $0 \leq n \leq 2n$, as shown in FIG. 8, whereas, for the symmetrical source-drain voltages, $n = n_2 =$ with $-n_s \leq n \leq n_s$.

Figure 9:
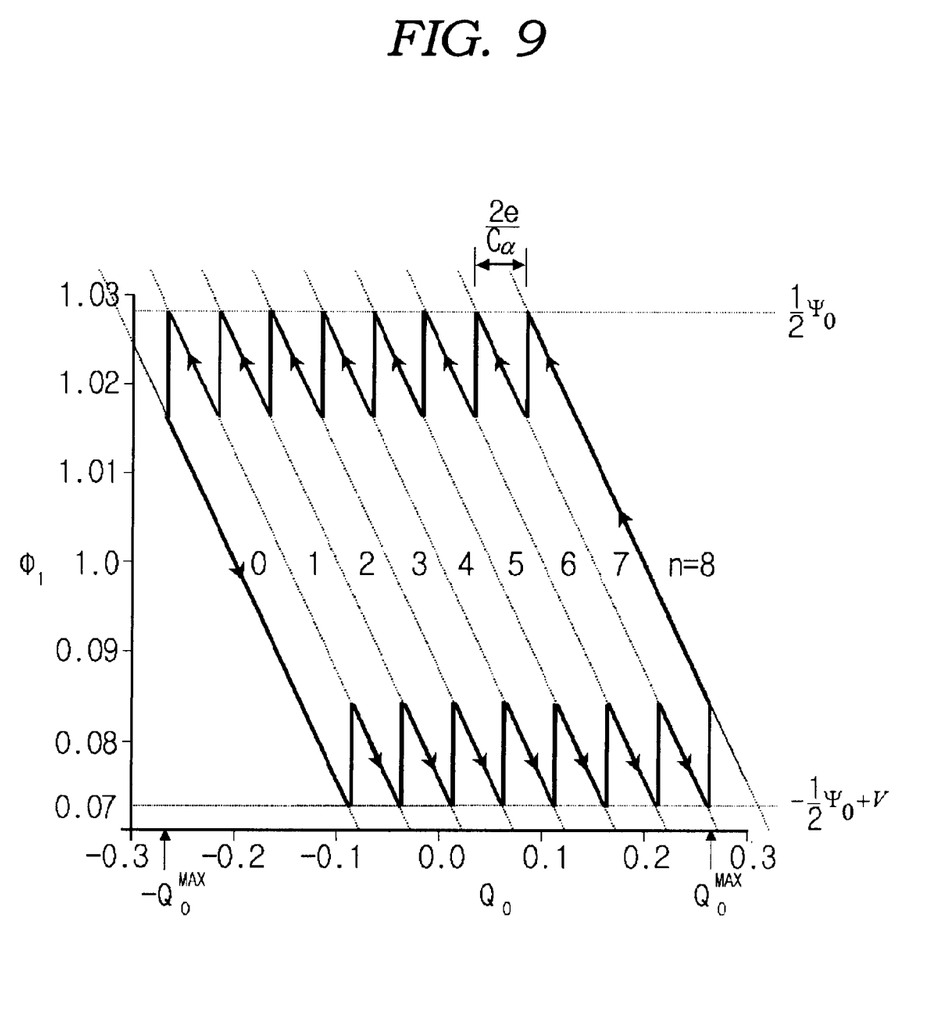
FIG. 9 shows the hysteresis loop exhibiting the memory operation of the single-electron memory device of the present invention when asymmetrical voltages are applied to the source and drain electrodes of the device in FIG. 1.

FIG. 9 shows the hysteresis loop which enables the memory operation of the single-electron memory device of the present invention when the asymmetrical voltage is applied across the source-drain electrodes of FIG. 1.

FIG. 9 for the asymmetrical bias voltages is similar to FIG. 6 for the symmetrical bias voltages, but for the asymmetrical bias voltages, $\Phi_{high} = \Phi_0/2$ and $\Phi_{low} = \Phi_0/2 + V$ whereas for the symmetrical bias voltages, $\Phi_{high} = (\Phi_0 - V)/2$ and $\Phi_{low} = -(\Phi_0 - V)/2$.

As mentioned above, the present invention provides the single-electron memory device based on the electron-hole Coulomb blockade phenomena in the parallelly coupled single-electron tunnel junction arrays.

The present invention has an advantage over the single-electron trap because the system according to the present invention may comprise smaller number of metallic islands or quantum dots. The present invention also has an advantage in fabrication such that the tunnel-junctions of the system according to the present invention may not be rigorously uniform, because the memory operation is based on the electrical coupling of electron-hole pairs.

Further, the present invention aims at realizing the next generation ultra-high integration memory device surpassing the physical limit of the existing silicon-based memory devices. In the conventional memory devices, hundreds of thousands of electrons are needed to represent the binary values of 0 and 1. However, in the single-electron memory device according to the present invention, only a few electron-hole pairs are needed to achieve the same goal, enabling high integration and extremely low power consumption.

Although representative embodiments of the present invention have been disclosed for illustrative purposes, those who are skilled in the art will appreciate that various modifications, additions and substitutions are possible without departing from the scope and spirit of the present invention as defined in the accompanying claims and the equivalent thereof.

What we claim:

1. A single-electron memory device using an electron-hole Coulomb blockade, comprising:

a plurality of quantum dot tunnel junction arrays including at least two tunnel junctions, coupled in parallel to each other, electrically coupled to each other, and separated from each other to prevent a single-electron tunneling between the quantum dot tunnel-junction arrays;

a gate electrode connected to one of the plurality of quantum dot tunnel junction arrays, wherein a gate voltage is applied to the gate electrode for varying a number of electron-hole pairs; and source electrodes and drain electrodes connected to each of the quantum dot tunnel junction arrays for applying a source voltage and a drain voltage, respectively.

2. The single-electron memory device of claim 1, further comprising:

a quantum dot tunnel junction array positioned oppositely to the quantum dot tunnel-junction arrays to which the gate electrode is connected, and electrically weakly coupled to an adjacent array for measuring potential changes between quantum dots.

3. The single-electron memory device of claim 1, wherein each of the parallel coupled quantum dot tunnel-junction arrays contains an odd number of quantum dots, and electrically coupled to each other only through the quantum dots located in the middle of each of the quantum dot tunnel-junction arrays, thereby preventing the fluctuation of the number of the electron-hole pairs.

4. The single-electron memory device of claim 1, wherein at least one double-junction quantum dot array is vertically coupled to the parallel coupled quantum dot tunnel-junction junction arrays to prevent the fluctuation of the number of the electron-hole pairs by the quantum fluctuations.

5. The single-electron memory device of claim 1, wherein the quantum dot that is coupled to the gate electrode includes the source and the drain electrodes where voltages are applied, thereby controlling the number of the electron-hole pairs.

* * * * *